United States Patent
Declercq et al.

(10) Patent No.: US 8,918,704 B2
(45) Date of Patent: Dec. 23, 2014

(54) DECODING METHOD AND APPARATUS FOR NON-BINARY, LOW-DENSITY, PARITY CHECK CODES

(71) Applicants: David Declercq, Ableiges (FR); Erbao Li, Zhengzhou (CN); Kiran Gunnam, San Jose, CA (US)

(72) Inventors: David Declercq, Ableiges (FR); Erbao Li, Zhengzhou (CN); Kiran Gunnam, San Jose, CA (US)

( * ) Notice: Subject to any disclaimer, the term of this patent is extended or adjusted under 35 U.S.C. 154(b) by 156 days.

(21) Appl. No.: 13/796,122

(22) Filed: Mar. 12, 2013

(65) Prior Publication Data

US 2013/0246894 A1  Sep. 19, 2013

Related U.S. Application Data (60) Provisional application No. 61/611,243, filed on Mar. 15, 2012.

(51) Int. Cl.
- *H03M 13/00* (2006.01)
- *H03M 13/25* (2006.01)
- *H03M 13/11* (2006.01)

(52) U.S. Cl.
CPC ........ *H03M 13/256* (2013.01); *H03M 13/1117* (2013.01); *H03M 13/112* (2013.01); *H03M 13/1171* (2013.01)
USPC .......................................................... 714/778

(58) Field of Classification Search
CPC . H03M 13/256; H03M 13/13; H03M 13/112; H03M 13/1171; H03M 13/2969
USPC .................. 714/746, 752, 778, 799, 800–801
See application file for complete search history.

(56) References Cited

U.S. PATENT DOCUMENTS

| | | | |
|---|---|---|---|
| 7,752,523 B1 | 7/2010 | Chaichanavong et al. | |
| 8,359,522 B2 | 1/2013 | Gunnam et al. | |
| 8,386,880 B2* | 2/2013 | Savin | 714/752 |
| 8,418,023 B2 | 4/2013 | Gunnam et al. | |
| 8,504,891 B2* | 8/2013 | Zhou et al. | 714/758 |
| 8,555,140 B2 | 10/2013 | Gunnam et al. | |
| 2010/0241921 A1 | 9/2010 | Gunnam | |
| 2011/0252286 A1* | 10/2011 | Li et al. | 714/755 |
| 2013/0019141 A1 | 1/2013 | Wang et al. | |
| 2013/0097469 A1 | 4/2013 | Gunnam et al. | |

OTHER PUBLICATIONS

Liu et al., Decoder design for Non-binary LDPC Codes, IEEE, 2011, p. 1 to 4.*
Declercq, David et al.; "Decoding Algorithms for Nonbinary LDPC Codes Over GF($q$)," IEEE Transactions on Communications, vol. 55, No. 4, Apr. 2007, pp. 633-643.
Robert G. Gallager; "Low-density parity-check codes;" Cambridge, MA:M.I.T. Press, 1963; 90 pages.
David J.C. MacKay; "Good error-correcting codes based on very sparse matrices;" IEEE Transactions on Information Theory, vol. 46, Mar. 1999; pp. 399-431.

(Continued)

*Primary Examiner* — Shelly A Chase
(74) *Attorney, Agent, or Firm* — Harness, Dickey & Pierce, P.L.C.

(57) ABSTRACT

Building and using sub-sets of configurations sets are provided to compute the check-nodes update by using a particular representation of the input messages, called here-after trellis-EMS (T-EMS). In a main aspect, the system provides a decoding method to compute $d_c$ output vectors of a non-binary parity-check (NBPC) equation decoding unit used for LDPC check codes defined in a NB space.

13 Claims, 7 Drawing Sheets

(56) References Cited

OTHER PUBLICATIONS

Kiran K. Gunnam, G. S. Choi, M. B. Yeary, and M. Atiquzzaman; "VLSI architectures for layered decoding for irregular LDPC codes of WiMax;" in Proc. of the IEEE International Conference on Communications (ICC'07), Jun. 2007; pp. 4542-4547.

Matthew C. Davey and D. MacKay; "Low density parity check codes over $GF(q)$," IEEE Communications Letters, vol. 2, No. 6, Jun. 1998; pp. 165-167.

Stephan Pfletschinger and D. Declercq; "Non-binary coding for vector channels;" in Proc. of the 12th International Workshop on Signal Processing Advances in Wireless Communications (SPAWC), Jun. 2011; 5 pages.

Lan Lan, L. Zeng, Y. Tai, L. Chen, S. Lin, and K. Abdel-Ghaffar; "Construction of quasi-cyclic LDPC codes for AWGN and binary erasure channels: A finite field approach;" IEEE Transactions on Information Theory, vol. 53, No. 7, Jul. 2007; pp. 2429-2458.

Charly Poulliat, M. Fossorier, and D. Declercq; "Design of regular $(2,d_c)$-LDPC codes over $GF(q)$ using their binary images;" IEEE Transactions on Communications, vol. 56, No. 10, Oct. 2008; pp. 1626-1635.

Adrian Voicila, D. Declercq, F. cois Verdier, M. Fossorier, and P. Urard; "Low-complexity decoding for non-binary LDPC codes in high order fields;" IEEE Transactions on Communications, vol. 58, No. 5, May 2010; pp. 1365-1375.

Yue Sun, Y. Zhang, J. Hu, and Z. Zhang; "FPGA implementation of nonbinary quasi-cyclic LDPC decoder based on EMS algorithm;" in Proc. of the International Conference on Communications, Circuits and Systems (ICCCAS), Jul. 2009; pp. 1061-1065.

E. Boutillon and L. Conde-Canencia; "Bubble check: a simplified algorithm for elementary check node processing in extended min-sum non-binary LDPC decoders;" Electronics Letters, vol. 46, No. 9, Apr. 29, 2010; 2 pages.

Erbao Li, K. Gunnam, and D. Declercq; "Trellis based extended min-sum for decoding non-binary LDPC codes;" in Proc. of the 8th International Symposium on Wireless Communication Systems (ISWCS'11), Nov. 2011; 5 pages.

Xiaoheng Chen and C.-L. Wang; "High-throughput efficient non-binary LDPC decoder based on the simplified min-sum algorithm;" IEEE Transactions on Circuits and Systems I: Regular Papers, vol. 59, No. 11, Nov. 2012; pp. 2784-2794.

Xiao Ma, K. Zhang, H. Chen, and B. Bai; "Low complexity X-EMS algorithms for nonbinary LDPC codes;" IEEE Transactions on Communications, vol. 60, No. 1, Jan. 2012; pp. 9-13.

Kiran K. Gunnam, G. S. Choi, and M. B. Yeary; "Value-reuse properties of min-sum for GF(q);" Texas A&M University Technical Note, published on Aug. 2010; 20 pages.

Ziao-Y. Hu, E. Eleftheriou, D.-M. Arnold, and A. Dholakia; "Efficient implementations of the sum-product algorithm for decoding LDPC codes;" in Proc. of the IEEE Global Telecommunications Conference (GLOBECOM), vol. 2, 2001; pp. 1036-1036E.

Jun Lin, J. Sha, Z. Wang, and L. Li; "Efficient decoder design for nonbinary quasicyclic LDPC codes;" IEEE Transactions on Circuits and Systems I: Regular Papers, vol. 57, No. 5, May 2010; pp. 1071-1082.

Christian Spagnol, E. Popovici, and W. Marnane; "Hardware implementation of GF(2m) LDPC decoders;" IEEE Transactions on Circuits and Systems I: Regular Papers, vol. 56, No. 12, Dec. 2009; pp. 2609-2620.

Xinmiao Zhang and F. Cai; "Efficient partial-parallel decoder architecture for quasi-cyclic non-binary LDPC codes;" IEEE Transactions on Circuits and Systems I: Regular Papers, vol. 58, No. 2; Feb. 2011; pp. 402-414.

Xinmiao Zhang and F. Cai; "Reduced-complexity decoder architecture for nonbinary LDPC codes;" IEEE Transactions on Very Large Scale Integration (VLSI) Systems, vol. 19, No. 7, Jul. 2011; pp. 1229-1238.

R. Michael Tanner; "A recursive approach to low complexity codes;" IEEE Transactions on Information Theory, vol. IT-27, No. 5, Sep. 1981; pp. 533-547.

Frank R. Kschischang, B. Frey, and H.-A. Loeliger; "Factor graphs and the sumproduct algorithm;" IEEE Transactions on Information Theory, vol. 47, No. 2, Feb. 2001; pp. 498-519.

Henk Wymeersch, H. Steendam, and M. Moeneclaey; "Log-domain decoding of LDPC codes over $GF(q)$;" in Proc. of the IEEE International Conference on Communications (ICC), vol. 2, Jun. 2004; pp. 772-776.

Valentin Savin; "Min-max decoding for non binary LDPC codes;" in Proc. of the IEEE International Symposium on Information Theory—Toronto, Ontario, Canada, Jul. 6-11, 2008; pp. 960-964.

Chung-Li Wang, X. Chen, Z. Li, and S. Yang, "A simplified min-sum decoding algorithm for non-binary LDPC codes;" IEEE Transactions on Communications, vol. 61, No. 1, Jan. 2013; pp. 24-32.

Kiran K. Gunnam, G. Choi, W. Wang, and M. B. Yeary; "A parallel VLSI architecture for layered decoding;" Texas A&M Technical Report, May 2007; pp. 1-54.

Luca G. Amaru, M. Martina, and G. Masera; "High speed architectures for finding the first two maximum/minimum values;" IEEE Transactions on Very Large Scale Integration (VLSI) Systems; vol. 20, No. 12, Dec. 2012; pp. 2342-2346.

R. Michael Tanner, D. Sridhara, and T. Fuja; "A class of group-structured. LDPC codes;" in the Proc. of ISCTA, Ambleside, England, 2001; 5 pages.

Kiran K. Gunnam, G. S. Choi, and M. B. Yeary; "Value-reuse properties of min-sum for GF(q);" Texas A&M University Technical Notem, published on Aug. 2010; 19 pages.

U.S. Appl. No. 60/830,045, entitled "Reduced-complexity decoding algorithm for non-binary LDPC codes;" inventors—Panu Chaichanavong and Gregory Burd; filed Jul. 2006.

\* cited by examiner

DECODING METHOD AND APPARATUS FOR NON-BINARY, LOW-DENSITY, PARITY CHECK CODES

CROSS-REFERENCE TO RELATED APPLICATION

This application claims the benefit and priority of U.S. Provisional Application Ser. No. 61/611,243, filed on Mar. 15, 2012, which is incorporated by reference herein.

BACKGROUND

Over the past decades, iteratively decodable codes, such as Turbo-codes and LDPC (Low Density, Parity Check) codes, have improved the area of error control coding, and these codes have found their way towards applications and standards. Although these codes have shown impressive results for binary transmissions where long code-words (for instance N higher than 10000) are used over ergodic memoryless channels, their advantage compared to other coding schemes weakens when the application constraints include: (i) Very high-throughput transmission requiring multi-antenna communication or very-high order modulation (256-QAM and beyond), (ii) short frame transmission (typically N=[500, 3000]), when latency issue is concerned to ensure real-time transmissions, or (iii) quasi-error free transmission, where very low frame error rates (FER) are required (typically below FER=$10^{-9}$).

After the early works of Davey, non-binary (NB) generalizations of LDPC codes have been extensively studied in the academic world. This includes in particular non-binary LDPC codes defined on larger order Galois fields GF(q). The important gains that NB-LDPC codes provide have to be balanced with the increased decoding complexity of NB-LDPC decoders, which has often been thought as an unavoidable bottleneck preventing the implementation of NB-LDPC decoders in practical apparatus.

It has been shown that simplified, sub-optimal implementations of NB-LDPC decoders are industrially feasible, in terms of implementation complexity, the complexity of the check-node operator has been reduced from $O(q^2)$, for a direct implementation of the belief propagation (BP) update equations [4], to $O(n_m \log n_m)$, with $n_m \ll q$, using an Extended Min-Sum (EMS) algorithm. The EMS algorithm is known based on the algorithm of Declercq et al described in "Decoding Algorithms for NB-LDPC Codes over GF(q)", *IEEE Trans. On Commun.*, vol. 55(4), pp. 633-643, April 2007. A representation of the check-node update and use such representation to limit the number of configurations in the EMS algorithm from K. Gunnam et al, in "Value-reuse properties of min-sum for GF(q)", *Texas A&M University Technical Note*, October 2006. Both of these references are incorporated by reference herein.

The EMS algorithm has received much attention as it reduces both the computational and the storage complexities by choosing only $n_m$ most reliable values from each incoming vector message. With only $n_m$ values in each message, the EMS algorithm builds configuration sets $\text{conf}(n_m, n_c)$, where $n_c$ is the number of deviations from the most reliable output configuration, and computes the extrinsic messages using those sets.

However, a need is still present to lower the ordering complexity of the check-node processing, the memory requirements and the decoding latency since these constraints are not specifically reduced by the here-above EMS algorithm, in particular in view of the applications: windshield wiper devices, connecting rod for transmission, error correction coding for food packaging, error-correcting code magnetic recording applications, etc.

In particular, iterative forward-backward (F/B) approaches are used in computing check-node output messages. The storage of the intermediate results of the forward and backward computations requires a large memory as well as involving more computations.

SUMMARY

According to the invention, a new way of building and using sub-sets of configurations sets is provided to compute the check-nodes update by using a particular representation of the input messages, called here-after trellis-EMS (T-EMS) in the detailed embodiments of the invention. The approach consists to recognize that the combinations used in all $d_c$ check-node output messages are similar. So instead of doing this heavy computation $d_c$ times, it attempts to do it one time for an extra check-node output and modify the computation result for each check-node unit output.

In a main aspect, the invention provides a decoding method to compute $d_c$ output vectors of a non-binary parity-check (NBPC) equation decoding unit used for LDPC check codes defined in a NB space, comprising the steps of:

converting reliability vector messages of $d_c$ input vectors of a NBPC equation decoding unit to reliability vector messages of a delta domain, computed in logarithm-form with a value of maximum reliability as a reference for the corresponding conversion of an input vector to the delta domain reliability vector;

determining one or more minimum values among each and every collection of the delta domain input vector entries corresponding respectively to each and every possible non-zero state of the NB space;

storing in a final state (FS) storage, for respectively each and every possible non-zero state of the NB space, one or more minimum values and indicia of minimum values locations in an extra compressed state, called FS as above;

computing a FS reliability, for each and every possible non-zero state of the NB space, as a result of a selection either of the minimum value of the considered non-zero state of the NB space, or of a combination sum of at least two minimum values stored in the FS storage;

setting the FS reliability for the zero state of the NB space as zero, and computing the $d_c$ output vectors of reliabilities in a delta domain representation, based on the minimum values and indicia of minimum values locations stored in the FS storage and the FS reliabilities.

With such a representation, we can directly work on a space by considering a particular built of a FS reliability which serves as a new reliability measure to sort configurations. In this representation, most reliable values (or messages) from the $d_c$-sized vector (where $d_c$ is the check-node degree) can be selected in the representation, and then combined at most some of them to form the output message at check-node, now representing the number of selections from the most reliable configuration. It reduces the number of configurations tested, especially for large values of $d_c$. It has been shown by simulations that the gains in complexity do not impact the error correction performance of the algorithm.

Another advantage is that, thanks to the structure of the particular representation of the present invention (also called trellis in the detailed description of embodiments) and the inclusion of the extra compressed state, in a particular a column—which represents reliabilities of the syndrome values—it is possible to perform the check-node updates in a block-wise fashion. Thus, the $d_c$ output vector messages can be computed from the $d_c$ incoming messages in parallel, and not sequentially or in a forward-backward (F/B) fashion. As a result, with a sufficient level of parallelism in the hardware implementation of the said particular representation, a factor gain of $d_c$ could be achieved in decoding throughput/latency compared to other algorithms. Furthermore, the number of paths on the T-EMS is substantially lowered regarding EMS or EMS (F/B) and, consequently, the ordering complexity.

In preferred aspects according to the method of the invention:

it further includes storing FS reliabilities in the FS storage and accessing them from FS storage to be used for the computation of the dc output vectors of reliabilities in the delta domain representation;

the computation of the FS reliabilities for each and every non-zero-state of the NB space uses the selection of one minimum corresponding to the same non-zero state of the non-binary space or the combination sum of at least two minimum values corresponding to different non-zero states of the non-binary space, the minimum values used in the combination sums corresponds to non-zero states of the non-binary space pairwise distinct from each other's;

the computation of the FS reliabilities for each and every non-zero-state of the NB space uses the selection of one minimum or the combination sum of at least two minimum values, while the $d_c$ output vectors of reliabilities in the delta domain representation are computed using an equal or larger number of minimum values compared to the number of minimum values used for the computation of the FS reliabilities;

the computation of the final state reliabilities for each and every non-zero-state of the NB space uses only one minimum, while the $d_c$ output vectors of reliabilities in the delta domain representation are computed using two or more minimum values stored in the FS storage;

it further comprises of storing the minimum values in the dc output vectors of reliabilities in the delta domain representation, in addition to storing the minimum values in the FS storage;

it further comprises of computing the $d_c$ output vectors of reliabilities of a check-node in the delta domain representation can be scheduled any time after the availability of compressed state of that check-node;

it further comprises of summing the check-node units output message and check-node units input message to produce a total reliability message;

it further comprises of generating computing the $d_c$ output vectors of reliabilities in the delta domain representation belonging to previous iteration, during current iteration, based on the minimum values and indicia of minimum values locations belonging to previous iteration that are stored in the FS storage;

it further comprises of delaying a check-node units input message in a memory until a check-node unit output message is generated.

According to another main aspect of the invention, a decoding apparatus for NB-LDPC codes is provided. Software instructions programmed into a non-transient memory (such as ROM, RAM and/or removable memory) of a computer controller, having an input (such as a keyboard), output (such as a display screen), and microprocessor, operably run a decoding calculation ad steps for NB-LDPC codes. Such software includes an EMS calculation and logic in the particular representation defined here-above and called a trellis arrangement or T-EMS.

In this respect, a decoding apparatus of the invention for decoding $d_c$-sized vector messages comprises a check-node unit (CNU) architecture with two units in connection for each CNU, a Min-finder unit which builds the delta domain trellis representation which contains the minimum values and computes the FS and a V-select unit which computes extra compressed values and extrinsic V messages, such units further comprises, in the Min-finder unit:

a series of parallel entries for respective incoming vector messages;

a series of registers to store indicia of each incoming message in connection with the respective entry;

a series of substrators to transform each message to the delta domain in connection with the respective register;

a Min-finder tree to select minimum values and indicia from transformed $d_c$-sized vectors;

and, in the V-select unit:

an extra-out block to generate FS reliabilities, also called syndrome reliabilities, based on the values stored in the FS registers;

a $d_c$-out block composed of subtractors to fill all the $d_c$ extrinsic messages with the syndrome values and the stored configurations;

a message de-map block composed of substrators to transform the messages back to output messages of the normal domain.

Thus, in a particularly simple way, when there is a need to regenerate the check-node outputs, the compressed information stored as the FS can be directly taken and a V-select unit can be used instead of storing all the messages in case of EMS (which takes more memory as compared to FS). In T-EMS, it is just needed to add an extra node, then build the set $d_c$ times once and all dc output are filled immediately, while with EMS $d_c$ different circuits are needed.

Other advantage is the very low complex parallel CNU to build all the check-node outputs in one shot for reduced latency. The Min-finder unit can be built, in particular, by comparator tree circuits to generate the FS in one clock. Furthermore, the V-select unit which generates V outputs from FS in one clock is optimally achieved.

According to particular features:

the minimum values are stored in final states registers;

the extra-out block is composed of adders and multiplexers;

the configuration associated to each syndrome value and indicia of minimum values are stored in temporary registers of the extra-out block.

In other respects, a block parallel layered decoder architecture of the invention comprises one CNU and a second V-select unit to compute the FS reliabilities values and the extrinsic V messages, said V-select unit being also composed of an extra-out block, a $d_c$-out block and a de-map block. Alternatively, the extra-out block of the second V-select unit is removed and the FS reliabilities values are also stored in final state storage.

A high-level hardware model of trellis representation under layered scheduling is presented and hardware synthesis measures computed on a high-rate GF(4) NB-LDPC code are detailed here-after. For instance, the present invention has a decoding throughput up to 3.6 Gbits/s with a resonnable synthesis area. Monte Carlo simulations are conducted for various codes, and comparison with the BP-decoder and the regular EMS-decoder are shown here-after.

BRIEF DESCRIPTION OF THE DRAWINGS

Other data, features and advantages of the present invention will appear on examining the hereafter detailed description of non-limiting embodiments in view of the appended drawings which represent, respectively.

DETAILED DESCRIPTION OF PREFERRED EMBODIMENTS

Some basic notations and definitions used throughout the description. A NB-LDPC (non-binary low-density parity-check) code is defined by a very sparse parity-check matrix $H_{M \times N}$ (hereinafter referred to as H), which can be represented by a bipartite Tanner (or factor) graph. The matrix H has M rows and N columns: each row corresponds to one non-binary parity-check equation (i.e. one check node of the Tanner graph) and each column corresponds to one GF(q) symbol of the code-word (i.e. one variable node of the graph). To simplify the description of the Tanner graph and the message passing algorithms, we use a single notation $d_v$ for the variable nodes degree and $d_c$ for the check nodes degree.

When the LDPC code has irregular degree distribution, the values of $d_v$ and $d_c$ are varying with the nodes indicia. Let α be a primitive element in GF(q), then all the elements in this field can be represented as: 0, 1, α, $α^2$, ..., $α^{q-2}$. The code rate is defined as R=(N−M)/N, assuming that the matrix H is full rank. Let $\{h_{vc}\}_{v,c}$ denote the non-binary elements in the matrix H, which are values in the Galois field GF(q). The c-th parity check equation can be written as $$\sum_{v=1}^{d_c} h_{vc} x_v = 0 \text{ in } GF(q)$$

where $x_v$, v=1 ... $d_c$ are the code symbols involved in the c-th parity check equation. In reference to FIG. 1, $d_c$=3.

In order to decode a NB-LDPC code, one uses iterative message passing decoders, for which the messages are defined as q-dimensional vectors. We will use the notations of FIG. 1 for the vector messages. Aside from the variable nodes (VN) and the parity-check nodes (CN), the factor graph of a NB-LDPC code comprises extra function nodes named as permutation node PN, which represents the action of the non-binary values in H. Let $V_{pv}$, p=1 ... $d_v$ denote the vector messages coming into VN v of degree $d_v$, and $U_{vp}$ be the output vector message of v. The entry $U_{vp}[β]$ in the vector message means that the variable node v takes the value β de GF(q) with reliability $U_{vp}[β]$. The notation 'vp' means that message flows from VNs to PNs, and 'pv' means that the message goes in the opposite direction. We define similar vector messages $U_{pc}$, p=1 ... $d_c$ and $V_{cp}$ for a degree $d_c$ CN.

All practical decoders are defined in the logarithm domain, and can be decomposed into the five following steps. Note that in this description, all messages are assumed to be vectors of size q.

Initialization:

For each variable node v (v=1 ... N), the initial Log-Likelihood ratio (LLR) message is given as:

$$L_v[β] = \log \frac{Pr(y_v/x_v = β)}{Pr(y_v/x_v = 0)}, β \in GF(q). \tag{1}$$

where $x_v$ (resp. $y_v$) is the coded symbol (resp. channel value) corresponding to the v-th variable node.

During the first iteration, each variable node sends the vector message $U_{vp}[β]=L_v[β]$ to the permutation nodes connected with it. Note that taking $x_v=0$ as reference symbol is arbitrary, and other equivalent LLRs could be defined.

Variable Nodes Update:

Each variable node v has $d_v$ incoming messages $\{V_{pv}\}_p$= 1 ... $d_v \in R^q$. By combining the channel values with extrinsic input messages, the variable node v sends the extrinsic output messages $U_{vp}$ to its adjacent permutation nodes:

$$U_{vp}[β] = L_v[β] + \sum_{t=1, t_-=p}^{d_v} V_{tv}[β], β \in GF(q) et p = 1 ... d_v. \tag{2}$$

Permutation:

During the decoding of NB-LDPC codes, we need to perform permutations of the vector messages due to the effect of the non-binary elements $h_{vc}$ labeling the edges of the Tanner graph. The output message of a variable node is permuted as:

$U[β]=U[h^{-1}β],β$ in GF(q) p=1 ... $d_v$.

After the check node update, the inverse permutation is performed as:

$V_{pv}[β]=V_{cp}[h_{vc}β],β$ in GF(q) p=1 ... $d_c$.

Check Node Update:

For each check node c, we consider $d_c$ incoming messages $\{U_{pc}\}$ p=1 ... $d_c \in R^q$. The check node c sends extrinsic output messages $\{V_{cp}\}$ p=1 ... $d_c$ to its $d_c$ adjacent permutation nodes. The check node update function for a Min-Sum based algorithm consists in replacing the convolution operation of the BP equations by a min operation, the following way:

$Vcp[β]=\min ΣU[β]β$ in GF(q) (3).

The complexity of the check node update is of the order of $O(q^2)$ using a recursive implementation of (3), in the so-called Forward/Backward (F/B) manner.

Tentative Decision:

For each variable node v, the estimated symbol $\hat{x}_v$ is deduced from the $d_v$ incoming vector messages of the adjacent permutation nodes and the channel value.

$$\hat{x}_v = \arg\max(\mu_v[\beta]) \quad (4)$$

where dv $\mu_v[\beta]=L_v[\beta]+\Sigma V_{p,v}[\beta]$, $\beta$ in GF(q).

For NB-LDPC decoding, the most complicated step is the check node update and the complexity increases significantly as the field size q and the check node degree $d_c$ increase. The EMS algorithm that we briefly describe below has been introduced to reduce the complexity of the parity-check node update.

In EMS, the messages are truncated to only $n_m \ll q$ values by selecting the $n_m$ most reliable values in each message. To reduce the complexity of the check-node update, configuration sets are defined in the following manner:

$$\mathrm{con} f(n_m) = \{\beta_K = [\beta^{(k_1)} \ldots \beta^{(k_{dc-1})}]^T, K=[k_1 \ldots k_{dc-1}]^T \text{ in } \{1 \ldots n_m\}^{dc-1}\} \quad (5).$$

where $k_i$ in the configuration set means the $k_i$-th most reliable value from the i-th incoming vector message. Any vector of $d_c-1$ field elements $\beta^{(k_i)}$ in this set is called a configuration.

The configuration set con f(1) contains only one element which forms the most reliable output configuration. We denote it, in the rest of the paper, as 0-order configuration. A configuration which differs from the 0-order configuration is called a deviated configuration. In order to further reduce the number of configurations used for the check-node update, one can restrict the maximum number of deviations from the 0-order configuration to $n_c$. Let us assume that the output message is at the $d_c$-th edge of the check-node, the following configuration set:

$$\mathrm{conf}(n_m,n_c) = \{\beta_k \text{ in } \mathrm{conf}(n_m,n_c) : \beta + \Sigma\beta_p^{(kp)} = 0\} \quad (6).$$

is used to compute the output value at index $\beta \in GF(q)$ of the $d_c$-th output message. Using this definition of configuration set, the EMS update equation for the check-node can be written:

$$Vcd_c[\beta] = \max \Sigma U_{pc}[\beta^{(kp)}] \beta \text{ in } GF(q) \quad (7).$$

All practical decoders are defined in the logarithmic domain, and can be generally decomposed into five steps: initialization, variable nodes update, permutation, check node update and tentative decision. In EMS, the messages are truncated to only $n_m \ll q$ values, by selecting the $n_m$ most reliable values in each message.

Figure 2:
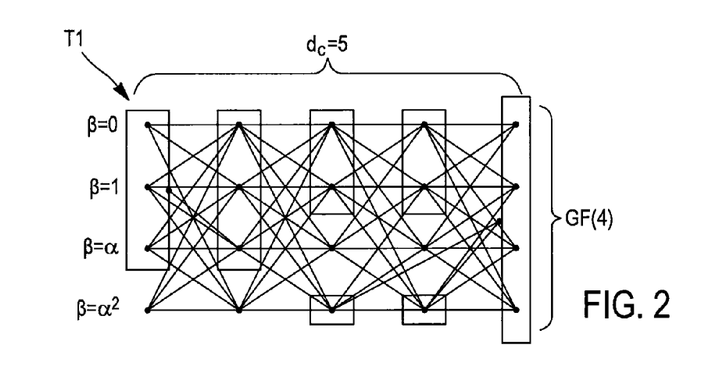
FIG. 2, an example of graphical trellis representation (T-EMS) of check-node input messages according to the invention with $n_m$ most reliable values from each input message.

To stress out the differences between the EMS and the T-EMS representation according to the invention, a trellis T1 of messages for a check node with degree $d_c=5$ on GF(4) is represented in FIG. 2 with $\beta=0, 1, \alpha, \alpha^2$ and $n_m=3$. Each row represents the possible symbol values in GF(4). The graphic representation illustrating the T-EMS below is a trellis as it is a periodic representation of a time series. Here, the time series is the sequence of Galois Field symbols that compose a parity-check equation.

In the trellis, the solid path connects the most reliable values of each incoming vector message and forms the main path corresponding to the 0-order configuration in con $f_\beta(n_m, n_c)$. The most reliable path is formed from the sequence of field values $\beta_p^{(0)}$, $p=1 \ldots d-1$. Then, we select $n_c$ columns from which deviated symbols are chosen from the second largest value to the $n_m$-th largest value. The update of the output message is then the maximum reliability of all configurations in $\mathrm{conf}_\beta(n_m, n_c)$.

Besides, concerning the decoding latency, in the implementations of the EMS representation, the check-node update is based on a sequential computation of the elementary steps, and it is indeed difficult to then consider a parallel hardware implementation that would reduce the decoding latency. Even with a high degree of parallellism allowing the computation of one elementary step in one clock cycle, the minimum number of clock cycles to implement the check-node update is $d_c-1$, and as a result, the decoding latency is very poor for high rate codes, i.e. large values of $d_c$. The T-EMS representation according to the invention reduces the number of required configurations for the message updates, and solves the latency issues.

Figure 1:
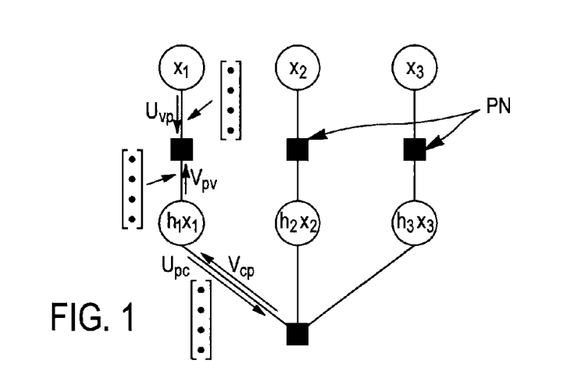
FIG. 1, an example of a NB-LDPC graph with a representation of messages notations.

In order to introduce the T-EMS representation, a particular vector message domain is used: the delta-message domain. Let $U_{pc}$ (FIG. 1) be a full (not truncated) vector message of size q, and $\beta^{(0)}$ be the index of the most reliable element p in this vector. The delta-message associated with $U_{pc}$, and denoted as $\Delta U_{pc}$ is defined by:

$$\Delta U_{pc}[\eta = \beta_p^{(0)} + \beta] = U_{pc}[\beta_p^{(0)}] - U_{pc}[\beta], \beta \text{ in } GF(q), p = 1 \ldots d_c \quad (8).$$

Using the largest element as reference makes the delta messages entries all positive.

Using this representation, the k-th most reliable index in a message corresponds to the k-th smallest value in the delta domain, so that the 'maximum' operator of the preceding section will be replaced by 'minimum' operator. When the messages are considered in their non-delta form, they will be referred to as normal-domain messages.

Figure 3:
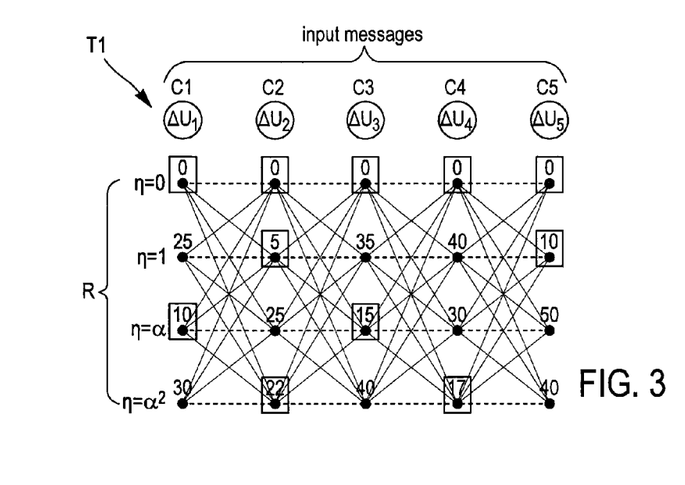
FIG. 3, an example of a graphical trellis representation in GF(4) for such check-node input messages in the delta domain.

The trellis T1 of a check-node is transformed from the original one in FIG. 2 to a trellis in the delta domain, as shown in FIG. 3, which shows the T-EMS in GF(4) for delta message $\Delta U1$ to $\Delta U5$ and delta index, $\eta=0, 1, \alpha, \alpha^2$. With the trellis representation according to the invention, the most reliable output path (0-order configuration) corresponds to the first row of the trellis. The deviated configurations forming the configuration sets will be chosen in this trellis.

Additionally, an extra column is added in the trellis T1, whose purpose is to represent syndrome values of the non-binary parity-check. Let $\beta_p^{(0)}$, $p=1 \ldots d_c$ denote the Galois field values forming the 0-order configuration. The $d_c$ input are considered together (instead of only the $d_c-1$ extrinsic messages). The value $\beta_{max} = \Sigma \beta_p^{(0)}$ is the syndrome value of the parity-check equation, when the most reliable values is used in the messages $U_{pc}$, $p=1 \ldots d_c$ for each of the incoming symbols.

Figure 5:
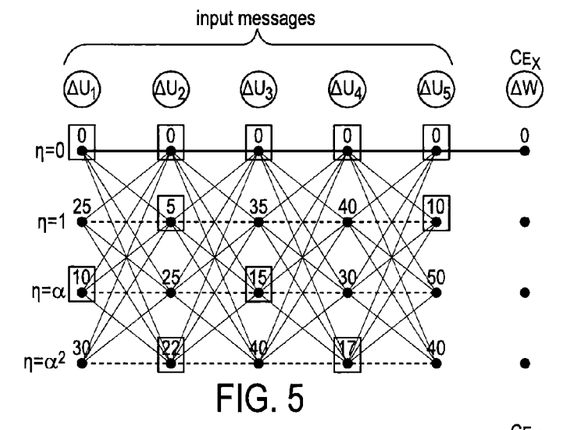
FIGS. 5 to 8 an example of filling the respective rows 0, 1, α, and $α^2$ of an extra column output index to compute the extra check-node output messages.

FIGS. 5 to 8 show the filling of the extra column $C_{Ex}$ with output indicia 0, 1, $\alpha^2$, $\alpha^2$ of the vector $\Delta W$. In FIG. 5, the output index is 0. The value $\beta_{max}$ is used to build the delta domain representation of the extra column $C_{Ex}$ in the trellis T1, which makes the 0-order configuration path to end at the zero state in the delta domain trellis. When the values $\beta^{(0)}$, $p=1 \ldots d$ verify the parity-check, then $\beta=0$. The log-reliability metric $L_{max}$ associated with $\beta_{max}$ is defined as:

$$L_{max} = \Sigma U_{pc}[\beta_p^{(0)}], \beta_{max} = \Sigma \beta_p^{(0)} \quad (9).$$

The deviations are built from selected states in the trellis T1 that are chosen row-wise. Only the $n_r$ minimum values out of the $d_c$ possible values are kept, and a deviated configuration of order $n_c$-which differs from the 0-order configuration in only $n_c$ indicia—involves the selection of $n_c$ different rows in the delta domain trellis.

The configuration sets are denoted Tcon $f_\eta(n_r, n_c)$, accordingly. Following the notations of configuration sets in equation (6), but changing the symbol notations from the normal domain to the delta domain, a configuration in the delta domain trellis is denoted by $\eta_K = [\eta^{(k_1)} \ldots \eta_{dc}^{(k_{dc})}]^T$, where $\eta_p^{(k_p)}$ represents $k_p$-th symbol in the p-th column of the delta domain trellis. The possible values for $\eta_p^{(k_p)}$ belong to a limited number of trellis nodes, which are selected row-wise. Let us denote by "A" the subset of trellis nodes considered to build the configuration sets. Additionally, $A_p$ (respectively $A^j$) is the subset of A which contains the symbol values on the p-th column (respectively the j-th row) of the trellis T1. Therefore, we have:

$$A = \bigcup_{p=1}^{d_c} A_p = \bigcup_{j=0}^{q-1} A^j. \qquad (10)$$

$A^0$ contains all the symbols composing the first row (0-order configuration), that is $\beta^{(0)}$, p=1 . . . $d_c$, or equivalently $\eta_p^{(0)}$=0, p=1 . . . $d_c$. Then A is added to the $n_r$ smallest values in each row of the delta domain trellis, denoted as $A^j$=$(\eta_{kj1}^{(j)}, \ldots, \eta_{kjnr}^{(j)})$ for the j-th row, j=1, . . . , (q-1). The total number of nodes which compose A is therefore $d_c$+$n_r$(q-1). As a result of this selection of nodes in the trellis T1, the number of possible symbol values in each column p is not constant, as opposed to the conventional EMS representation, where exactly $n_m$ values were chosen in each column.

A simple numerical example based on trellis representation of FIG. 3 in the delta domain illustrates the functioning of the T-EMS representation according to the invention where: $n_r$=2 selected values in each row R, and the number of selected nodes in each column C is not constant as column C2 has 3 possible states (including the state of the 0-order configuration), while the other columns have only 2 possible states.

A configuration for the trellis T1 representation is then a deviated path, which differs in at most $n_c$ symbol locations from the 0-order configuration. The deviations are taken row-wise in the set "A" described above. In addition, when the NB-LDPC code is designed over an extension Field with characteristic 2, i.e. when q=$2^p$, and when $n_c \geq 2$, the deviated path is forbidden to select two nodes in the same row, such that all values in $\eta_K=[\eta_1^{(k_1)} \ldots \eta_{d_c}^{(k_{dc})}]^T$ which differ from the 0-order configuration belong to exactly $n_c$ different rows.

Indeed, in the case of binary extension Fields GF($2^p$), removing such deviated paths does not lose generality for the following reason. In the delta domain, let us take a path $\eta_K$ with $n_c$ deviations which has 2 deviated symbols in the same row j≥1 and for which the Galois field sum is equal to $\eta$=$\Sigma \eta_p^{(k_p)}$. A modified path $\eta^*_K$ with only $n_c$-2 deviations can be taken, such that the two symbols with the same row in $\eta_K$ are set to the symbols in the first row in $\eta^*_K$. Both configurations $\eta_K$ and $\eta^*_K$ have the same syndrome value $\eta$, but $\eta^*_K$ will always have a larger reliability (the symbols in the first row of the delta domain trellis are the ones with maximum reliability).

The deviated paths with two symbols in the same row j≥1 will then not contribute to the check-node update: they can be removed them from the configuration sets. The configuration set $Tconf_\eta(n_r,n_c)$ for the Trellis T1 representation contains all valid configurations used for the T1 representation, that have exactly $n_c$ deviations from the 0-order configuration. Finally the configuration set which contains all valid configurations with at most $n_c$ deviations is noted:

$$T\eta(n_r, n_c) = \bigcup_{n=1}^{n_c} Tconf\eta(n_r, n). \qquad (12)$$

The total number of configurations in $T_\eta(n_r,n_c)$ impacts the complexity of the decoding algorithm, and the T1 representation aims at minimizing the cardinality of the configuration sets when the delta domain trellis is used. The cardinality of $T_\eta(n_r,n_c)$ depends on how the $n_r$ (q−1) values are spread among the columns of the trellis. An upper bound on this number, which corresponds to the worst case where all selected values are spread uniformly among the trellis sections. This upper bound is given by $$\begin{bmatrix} q-1 \\ n_c \end{bmatrix} n_r^{n_C}$$

and does not depend on $d_c$, which makes the T-EMS complexity and latency approximately the same for all coding rates. This feature of the T-EMS representation is especially interesting for very high rate codes with R≥0.9, and for which the existing NB-LDPC decoders show a very poor latency.

The T-EMS representation as T1 is described now for the parity-check node update. Each node of the extra column $C_{Ex}$ reliability values stored in vector $\Delta W[\eta]$, $\eta$ in GF(q) (FIGS. 5 to 8). In particular, the path with maximum reliability in the delta-domain is stored in $\Delta W[0]=L_{max}$ (equation (9)). The check-node update is decomposed into four different implementation steps listed a) to d) hereafter and detailed further:

Step a) builds the delta domain messages $\Delta U_{pc}$, p=1 . . . $d_c$, and the corresponding trellis from the PN messages $U_{pc}$, p= 1 . . . $d_c$;

Step b) computes the configuration sets of the T-EMS, $T_\eta(n_r, n_c)$, and computes the reliabilities for the extra column $C_{Ex}$, $\Delta W[\eta]$, $\eta$ in GF(q) (these reliabilities are also referred as final state reliabilities or delta W reliabilities);

Step c) initializes output extrinsic messages $\Delta V_{cp}$ with the maximum allowed amplitude $A_{max}$, then compute the extrinsic messages for each output edge from the values of $\Delta W[\eta]$ n=0, . . . , $\alpha^{q-2}$;

Step d) transforms the messages back to the normal domain and performs offset/factor compensation.

In step a), the vector messages are not truncated to $n_m$ values, and the delta domain vector messages of size q are obtained using equation (8), for each incoming message $U_{pc}$, p=1 . . . $d_c$, of a check-node. In step b) of computing syndrome column reliabilities from configuration sets: the configuration sets $T_\eta(n_r,n_c)$ is computed following equations (11) and (12). The reliabilities of the extra column $C_{Ex}$ are then updated using the configurations stored in $T_\eta(n_r,n_c)$ with the usual min( ) operator:

$$\Delta W[\eta] = \min \Sigma \Delta U_{pc}[\eta_p^{(kp)}] \qquad (13).$$

Due to the use of the extra column in the treillis, the minimum in (13) uses configurations built from all the $d_c$ incoming messages to a check node. Since we make use of all the extra column reliabilities $\Delta W[\eta]$, $\eta$ in GF(q) to compute the output extrinsic messages (see next step), there is no loss of generality in considering $d_c$ incoming messages instead of $d_c$ times ($d_c$−1) messages.

In other words, the configuration sets in the T-EMS are built such that they contain the configurations which lead to the maximum output reliabilities at the extrinsic level. Assume, for instance, that you want to fill the extrinsic value for the first entry of the $d_c$-th column, i.e. $\Delta Vd_cc[0]$. In the T-EMS, we consider all configurations such that $\eta=\eta_K^{(n)}(d_c)$ (from equation (14)). Since all q possible values of $\eta$ are computed in the last column with equation (13), the configuration with maximum reliability is neither missed.

Example (FIGS. 5 to 8): The first value $\Delta W[\eta=0]=0$ of the extra column $C_{Ex}$ is filled with the maximum reliability in the delta domain, which is zero, and the corresponding path is the 0-order configuration. The second value $\Delta W[\eta=1]=5$ of the extra column $C_{Ex}$ is filled with the sum of the reliabilities on the configuration which has only one deviation in the second column $\eta_K=[0\ 1\ 0\ 0\ 0]$. The third value $\Delta W[\eta=\alpha]=10$ corresponds also to one deviation, but this time in the first column, and finally, the last value $\Delta W[\eta=\alpha^2]=15$ corresponds to a configuration with 2 deviations $\eta K=[\alpha 1000]$.

In step c) of computing extrinsic output messages: from the previous step, the extra column vector $\Delta W[\eta]$, $\eta$ in GF(q), is now computed and the configurations (set of Field values) which have reliability $\Delta W[\eta]$ are also stored in a local memory. Let $\eta^{(n)}$ denote the configuration that has reliability $\Delta W[\eta]$. The output K messages $\Delta V_{cp}$, $p=1, \ldots, d_c$ are computed using the following equation:

$$\Delta V_{cp}[\eta_K^{(n)}(p)+\eta]=\min(\Delta V_{cp}[\eta_K^{(n)}(p)+\eta],\Delta W[\eta]-\Delta U_{pc}[\eta_K^{(n)}(p)])p=1\ldots d_c \qquad (14).$$

In equation (14), the index $\eta_K^{(n)}(p)$ corresponds to the deviation symbol in the p-th column, K for the configuration $\eta^{(n)}$ whose syndrome value is $\eta$. When a configuration has no K deviation at location p, then the update equation is restricted to a simple copy of $\Delta W[\eta]$.

The $d_c$ extrinsic messages $\Delta V_{cp}$ can be updated in parallel, using the reliabilities in the extra message $\Delta W$ and the local input messages $\Delta U_{pc}$. After this step is completed, there are some entries in the extrinsic messages that are not updated, and which have the initialization value $A_{max}$. For example, when a configuration has only one deviation in column p with symbol value $\eta_K^{(n)}(p)$, then since $\eta = n_p^{(kp)}$, the corresponding Kp output value would be at index 0 of the extrinsic message, i.e. $\Delta V_{cp}[0]$.

This entry has been already filled with the most reliable configuration $\Delta V_{cp}[0]=0$, and then will not be updated. But as a consequence, the entry $\Delta V_{cp}[\eta_k^{(n)}(p)]$ will not be updated either and will stay at its initialization value $\Delta V_{cp}[\eta_k^{(n)}(p)]=A_{max}$. For those output values which are not filled with equation (14) using only one deviation, the second minimum in the corresponding row to fill the required output value can be efficiently used, by replacing the value $\Delta V_{cp}[\eta_k^{(n)}(p)]=A_{max}$ by the second minimum in row $\eta_k^{(n)}(p)$. In the case that the missing output values are not filled with equation (14), and using configurations with more than one deviation, the missing entries can be filled either with the first minimum or the second minimum, depending if the first minimum is in the corresponding column or not.

Figure 6:
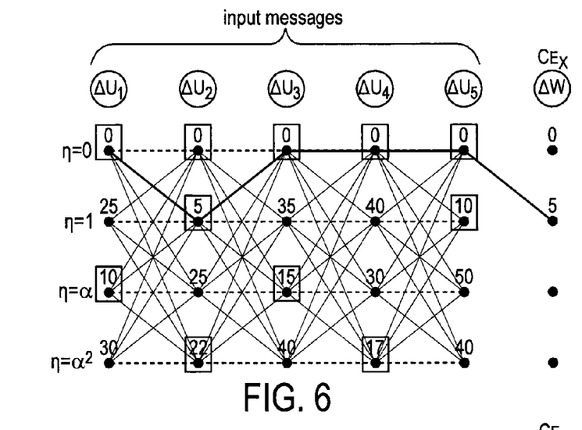
Figure 7:
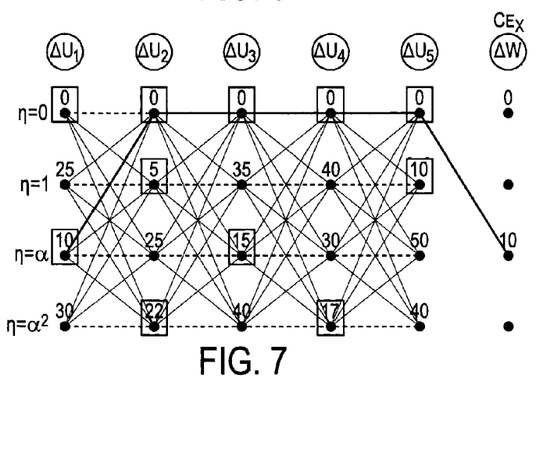
Figure 8:
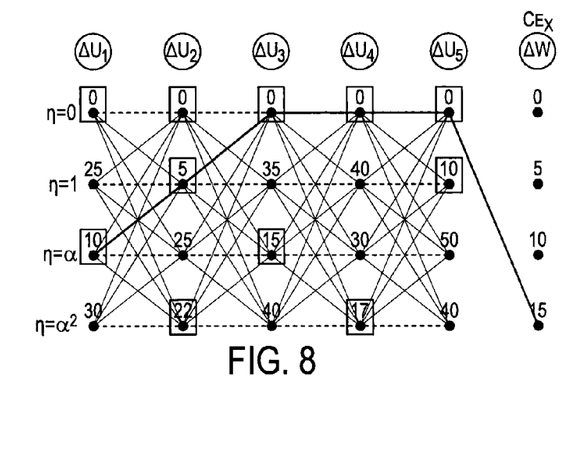
Figure 9:
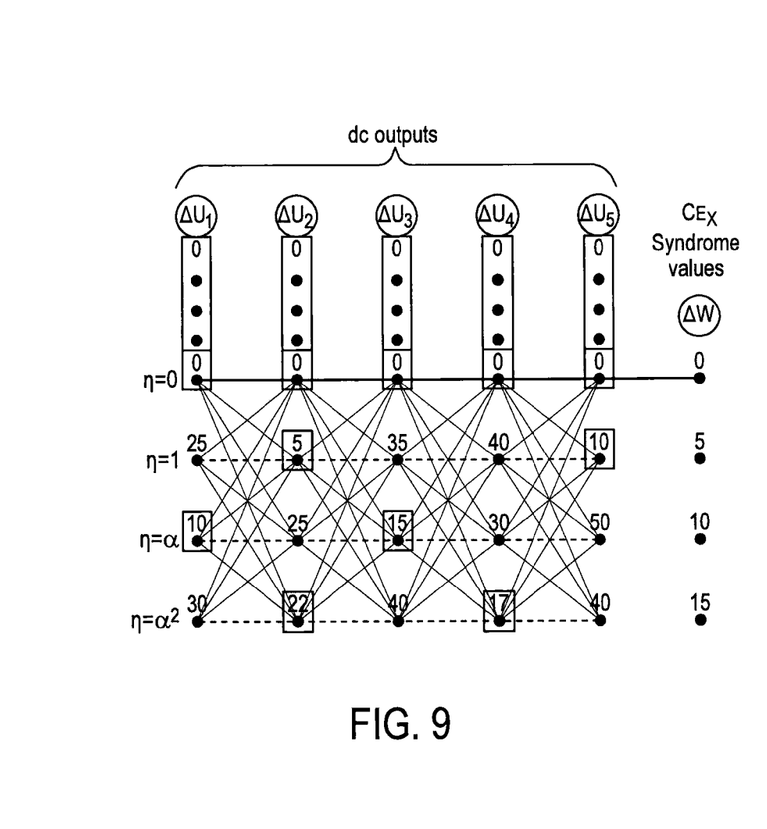
FIGS. 9-13, an example of filling the $d_c$ check-node output messages by using the results of the respective rows 0, 1, α, and $α^2$ of the extra column.
Figure 10:
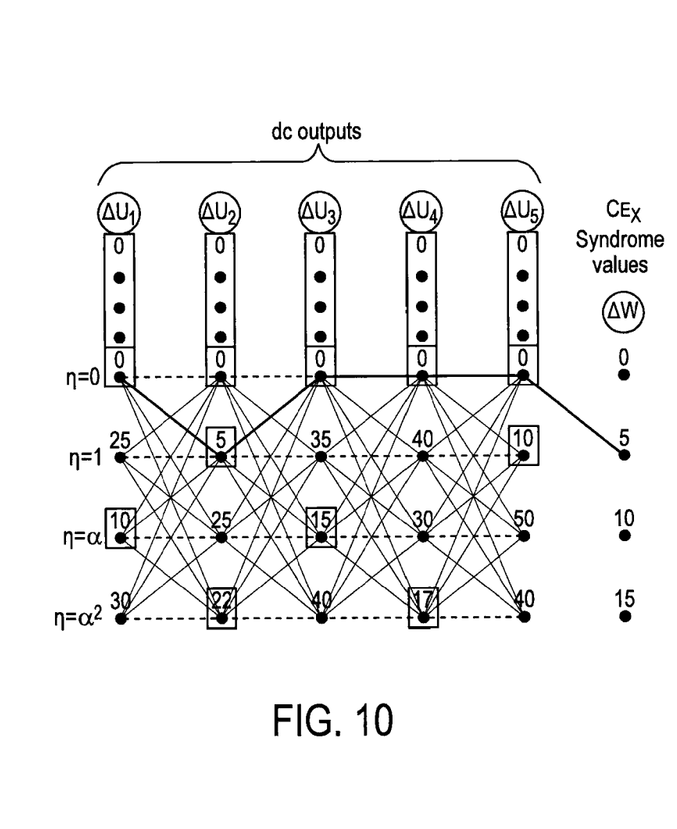
Figure 11:
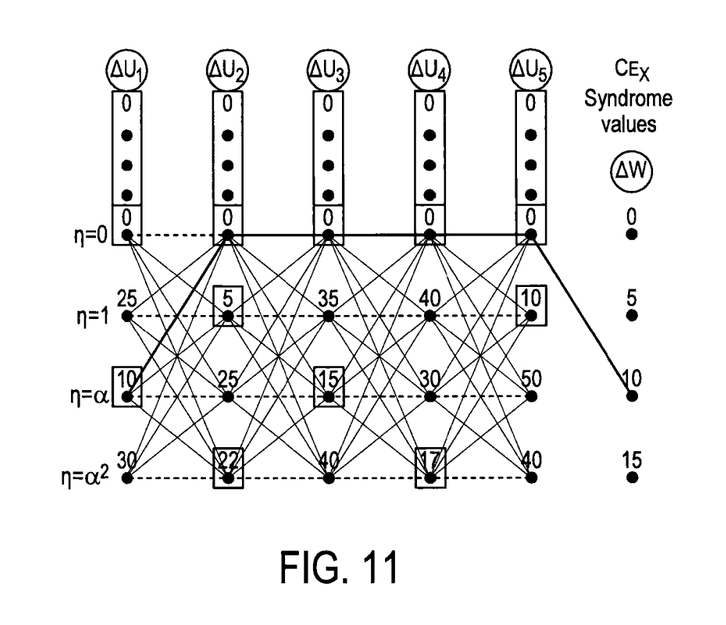

Thus, in the example of FIG. 6, the configuration $\eta_K=[01000]$ corresponds to $\Delta W[1]=5$ All the values of $\Delta V_{cp}[1]$, except in the second column, are set to the value of $\Delta W[1]=5$. For the value of the second column, since the output index is $\eta_K^{(n)}(p)+\eta=0$, this entry is already filled K with 0, and then will not be updated. As a consequence, the value of $\Delta V_{2p}[1]$ is not filled, and will be updated by the second minimum in the row $\eta=1$, i.e. $\Delta V_{2p}[1]=\Delta U_{p5}[1]=10$. We proceed the same way for the other values and configurations of $\Delta W[\eta]$.

As such, the output values filled (with the first minimum or the second minimum by the configuration of FIG. 13) are: $\Delta V_{1p}[1]=\Delta W[\alpha^2]-\Delta U_{p1}[\alpha]=15-10$, $\Delta V_{2p}[\alpha]=\Delta W[\alpha^2]-\Delta U_{p2}[1]=15-5$, $\Delta V_{3p}[\alpha^2]=\Delta W[\alpha^2]=15$, $\Delta V_{4p}[\alpha^2]=\Delta W[\alpha^2]=15$, $\Delta V_{4p}[\alpha^2]=\Delta W[\alpha^2]=15$.

In step d) of computing normal-domain message and compensate: Finally, the messages $\Delta V_{cp}$ are transformed back to the normal domain before the variable node update using the converse of equation (8):

$$V_{cp}[\beta=\eta-\beta_{max}+\beta_p^{(0)}]=-\Delta V[\eta], \eta \text{ in } GF(q), p=1\ldots d_c \qquad (15).$$

The index $\beta$ is calculated by subtracting the most reliable symbols' indicia in each column except the output column, i.e. $\beta_p^{(0)}$. The reason is that when the delta domain trellis is built with equation (8), $\beta_p^{(0)}$ is added in each node of every column p, so the output configuration contains the p sum of all these $\{\beta_p^{(0)}\}$, $P=1, \ldots, d_c-1$—which is $\beta_{max}$—in delta domain. When we transform the delta message domain back to normal domain, we therefore need to subtract $\beta_{max}-\beta_p^{(0)}$.

Now the messages need to be compensated in the normal domain before being used at the variable node update. Similarly to the case of other NB-LDPC decoders, the T-EMS representation can need an offset compensation in order to get good performance in the waterfall region. Since the delta messages are all non-negative, it follows that the normal domain messages are all non-positive, and the messages in the T-EMS are compensated with a positive offset value, as follows:

$$V_{cp}[\beta]=\min(V_{cp}[\beta]+\delta,0)\beta \text{ in } GF(q), p=1\ldots d_c \qquad (16).$$

Figure 4:
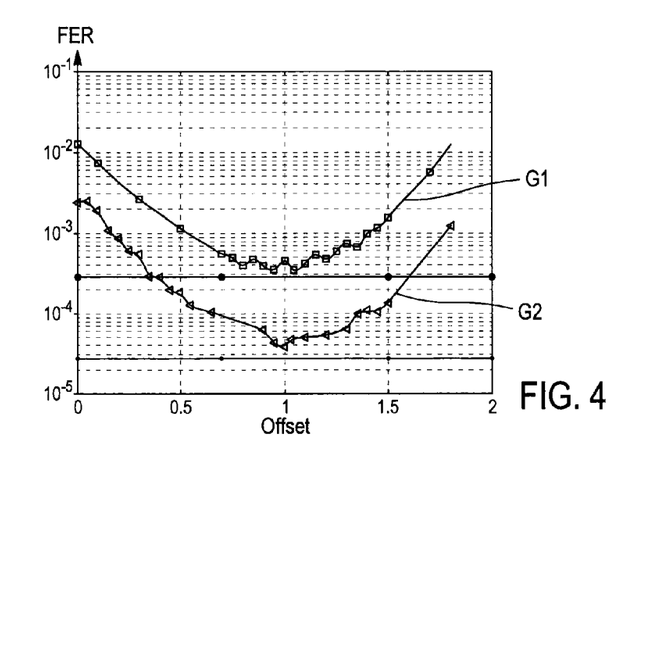
FIG. 4, a diagram of performance results (frame error rates (FER)) in view of the offset parameter δ optimization through Monte-Carlo simulation.

The offset parameter $\delta$ in equation (16) can be optimized through simulation or numerical density evolution. We draw in FIG. 4 the performance results (in terms of frame error rates (FER)) of offset optimization through Monte-Carlo simulation—for a length N=155, rate R=0.4 NB-LDPC code in GF(8) and decoded with the T-EMS representation—for different values of the offset parameter $\delta$ (0–2). The gain G1 with a compensation offset $\delta=1.0$ is large, and approaches the performance G2 of the BP decoder.

Figure 12:
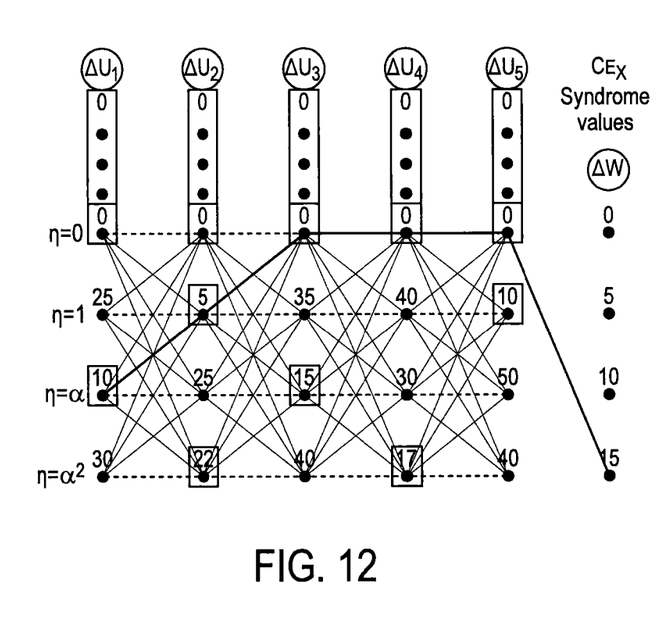

To further show how the decoding steps for T-EMS are calculated, FIGS. 5 to 8 show how the extra column $C_{Ex}$ values are filled, using equation (13). For each entry in the extra column $C_{Ex}$, there are several different configurations and the most reliable is chosen. FIGS. 9 to 12 show how the results of, respectively, 0, 1, $\alpha$, $\alpha^2$, in the extra column $C_{Ex}$ is used and the stored configurations to generate the $d_c$ outputs with equation (14) to fill, respectively, the $d_c$ output messages. In particular, FIG. 12 show some missing entries not yet filled. These entries are filled with the minimum or the second minimum values in the corresponding row to fill, as in FIG. 13.

Advantageously, the selection in T-EMS representation allows then for a dynamical consideration of different noise realizations on the codeword symbols. This allows to consider less configurations in the configuration sets, by focusing more efficiently than the EMS on the ones with the largest reliabilities. Another advantage of the T-EMS is the better latency coming from a higher degree of parallelism in the hardware implementation. Because the principle of the EMS is, in its F/B implementation, to decompose the check-node update into elementary steps that need to be computed sequentially, the best latency that one could expect is of the order of $d_c-1$ ($\log_2(d_c-1)$ when a tree-structure in implemented) clock cycles. This limitation becomes rapidly cumbersome when the check node degree $d_c$ grows ($d_c \geq 16$).

In T-EMS representation, the extra column corresponding to the syndrome reliabilities allows a fully parallel hardware model for the check-node update, as explained in section V. Indeed, once the reliabilities $\Delta W$ in the extra column have been computed, all the messages outputs can be filled in parallel using equation (14) for a given syndrome value q. This means in particular that the parameter $d_c$ does not impact anymore on the latency of the decoder. This is especially important since NB-LDPC codes have been advised mainly to replace RS or BCH codes for high rate applications. These two advantages are due to the specific features of the T-EMS, with full vector messages composed of q reliabilities.

Figures 13, 14, 15:
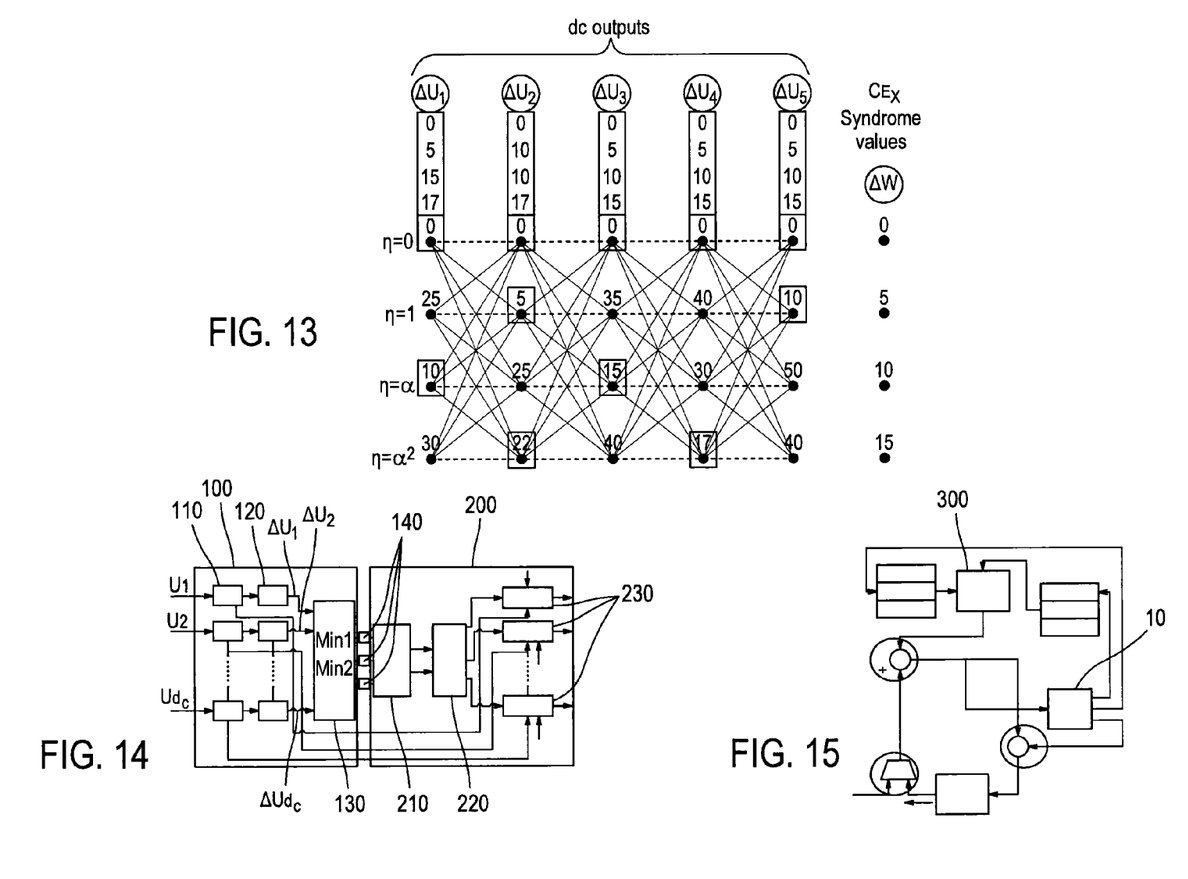
FIG. 14, an example of architecture of a check-node unit (CNU) in parallel implementation according to the invention.
FIG. 15, an example of a block parallel layered decoder architecture of the invention.

Efficient hardware realizations for T-EMS are now described. In FIG. 14, a micro architecture of parallel check-node unit CNU 10 is shown to implement the T-EMS representation. The CNU 10 is a combination of a Mn-Finfer unit 100 and a V-select unit 200 to implement two processing steps (e), (f) as described thereafter.

Step (e): the Min-finder unit 100 builds the delta domain trellis which only contains $(q-1) \times n_r$ minimum values, and computes the final state (FS) for each row of the delta-domain trellis. It is composed of the following blocks: Max 110, Map 120 and Min-finder-tree 130. Using equation (8), in the Max block 110, we find the most reliable value and its index $\beta_p^{(0)}$ for an incoming vector message U1, U2, ..., Ud$_c$. The indicia are stored in $\beta_{max}$ register (not shown) for each edge message vector.

Then, based on equation (8), we transform the message to the delta domain. This needs (q−1) subtractors (for the maximum value, we just set it to zero), which form the Map block 120. Now the $(q-1) \times n_r$ trellis nodes composing "A" need to be selected. For all the (q−1) rows aside from the main path, the Min-finder-tree 130 selects $n_r$ minimum values and indicia for $n_c-1$ minimums from a $d_c$-sized vector.

With $n_r=2$ in FIG. 14, (Min1, Min2) and (Min1Index, Min2Index) are computed at the end of this stage. These minimum values are stored in registers 140 called final states (FS). The Min Finder unit 100 can be built, for instance, by comparator tree circuits.

Step (f): the V-select unit 200 computes the extra column values and the extrinsic V messages. This unit 200 is composed of the following blocks: Extra-out 210, $d_c$-out 220 and De-map block 230.

The Extra-out block 210 builds the configuration set $T_\eta(n_r, n_c)$ and generates the syndrome reliabilities $\Delta W$ (i.e. extra column outputs) based on equation (13) using the values in the FS registers. For the computation of each syndrome value $\Delta W[\eta]$, the number of comparisons we need to do is $|T_\eta(n_r, n_c)|$. This number of comparisons is a key metric for the GNU complexity. The configuration associated to each of the value $\Delta W[\eta]$ is also stored. Since each configuration includes at most $n_c$ deviated positions, we store only the $n_c$ deviation row and column indicia.

For the case of configurations with one deviation, the output $\Delta W[\eta]$ is simply the Min1 value of the η-th row. For two deviations, the output $\Delta W[\eta]$ is the minimum between the Min1 value of the η-th row and all the combinations of message at index $\eta_1$ and $\eta_2$ such that $\eta_1+\eta_2=\eta$. For example, in GF (4), there is only one possible combination for each value of η (e.g. we can combine the two symbols $\eta_1=1$ and $\eta_2=1+\alpha$ to get $\eta=\alpha$).

Figure 16:
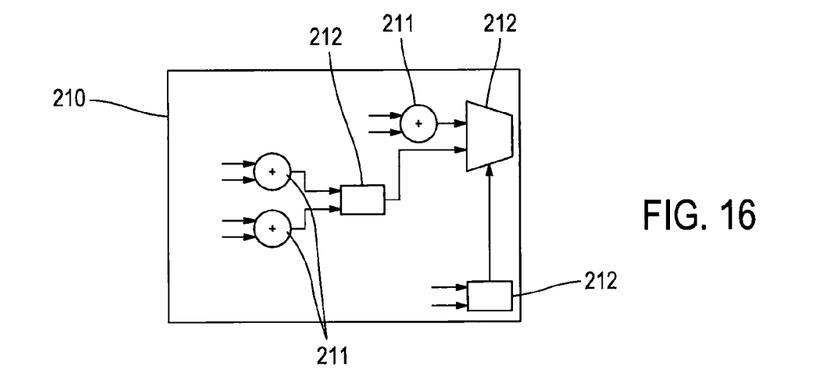
FIG. 16, an example of extra-out block of a V-select unit of the CNU of FIG. 14 or 15 to compute of the extra column output.

If the two Min1s of the symbols used in the combination are from different columns, the reliability of $\Delta W[\eta]$ is the sum of the two Min1s. Otherwise, $\Delta W[\eta]$ is assigned with the minimum between Min1$^{\eta_1}$+Min2$^{\eta_2}$ and Min1$^{\eta_2}$+Min2$^{\eta_1}$, where the superscript means the minimum values from that row. The row and column indicia for the deviations (i.e. $\eta_1$ and $\eta_2$ for the Min1s/Min2s used) are stored in temporary registers located in the Extra-out block 210. Thus the Extra-out block 210 consists of simple adders 211 and multiplexers 212 for each of the q−1 values $\Delta W[\eta]$ as shown in FIG. 16.

Using equation (14), the $d_c$-out block 220 fills all $d_c$ extrinsic messages with the values in $\Delta W$ and the q−1 stored configurations. Although equation (14) implies that we need $\Delta U_{pc}$ messages in addition to $\Delta W$ messages, the $\Delta U_{pc}$ messages are only used when a deviation is formed with this particular input. As a result, the required messages for a given row and column update is always either Min1 or Min2. The $d_c$-out block 220 requires $q \times d_c$ subtractors.

Finally, The message de-mapping in the De-map block 230 corresponds to the transformation of messages back to the normal domain, and is based on equation (15). This last step of the CNU requires q−1 subtractors.

As shown in the structure in FIG. 14, all output messages of check node unit 10 can be generated based on a) the extra column values—which in turn can be generated from min values stored as part of FS memories—and b) the minimum values stored as part of Final State.

In summary, all the check node output can be efficiently generated using min values stored in FS registers and hardware circuits consisting of multiplexors and adders/subtractors. The main advantage of this model of CNU 10 for the T-EMS representation is therefore its latency, compared to other existing decoders for which the serial implementation can induce a latency which grows linearly with $d_c$. With the T-EMS representation, we can generate all FS values in $\Delta W$ in one clock cycle using a comparator tree circuit. Then, the $d_c$ check node output messages can be filled in parallel in one clock cycle, using simple adders and multiplexer. In total, only two clock cycles can be used to perform the full check node update in T-EMS, while $d_c$ clock cycles are typically needed for the EMS algorithm with the F/B implementation. Another advantage of being able to generate $d_c$ check node output vectors by using values in FS storage and final state reliabilities is that this generation process can be scheduled at any time after the availability of values in FS and final state reliabilities.

Hardware model for a layered schedule decoder, for quasi-cyclic non-binary LDPC codes (QC-NB-LDPC) is now described. The decoders are applicable for both binary and non-binary LDPC codes. While using the same data path architecture, memory and decoder scheduling, we use the solutions presented here above to reduce the complexity of the parity-check node unit block of the decoder.

A QC-NB-LDPC is obtained through a protograph based construction, in which a small binary mother matrix is lifted to the actual parity check matrix, by replacing each and every "1" in the mother matrix by a block matrix of size p×p. The block matrix is either a diagonal composed of GF(q) values, or a cyclically shifted version of it. As a result of this particular construction: 1) one variable node symbol in a block participates in only one check equation in the block, and 2) each check equation in the block involves only one symbol from the block.

As example a QC-NB-LDPC code in GF(4) is used with constant connexion degree ($d_v=3, d_c=27$), and a block matrix size p=36. We use the labels S, U, V and HD for total reliability, variable node message, check node message and hard decision respectively. L stands for channel log-likelihood ratios. In a layered schedule decoding, the QC-NB-LDPC with $d_v$ block rows can be viewed as concatenation of $d_v$ layers or constituent sub-codes. We present the decoding structure for a single layer, referred to as the current layer, and for which we define a variable S which is initialized as $S_v[x]=L_v[x]$, x in GF(q). Let I denote the iteration number. For all the variable nodes which belong to the current layer, we update the messages $U_{vp}^{(I)}$ as:

$$U^{(I)}[x]=S[x]-V_{pv}^{(I-1)}[x], x \text{ in } GF(q) \tag{17}$$

In QC-NB-LDPC codes, the variable nodes in each layer just participate to one check node in the current layer. We update all check nodes in current layer as following:

$$V_{cp}^{(I)}[x]=f_2(FS_c^{(I)}), FS_c^{(I)}[x]=f_1(\{\Delta U_{tc}^{(I)}\}[x]), x \text{ in } GF(q) t=1,2,\ldots,d_c \tag{18}$$

where functions $f_1(x)$ and $f_2(x)$ describe the check-node processing for one layer using the variable FS introduced in the previous section. Then, the updated messages are immediately used to update the column sum $S_v$ as:

$$S_v[x]=S_v[x]+V^{(l)}_{vp}[x]-V^{(l-1)}_{vp}[x]=V^{(l)}_{vp}[x]+U^{(l)}_{vp}[x] \quad (19).$$

The values in $S_v$ are then provided for processing the next layer as in equation (18). This differs from the standard flooding decoding, where all check nodes are processed in a first half-iteration and then messages are propagated to the variable node processing for a second half-iteration. In a layered schedule, each decoding iteration is composed of $d_v$ sub-iterations (number of layers), and the completion of check-node processing and associated variable-node processing of all layers constitutes one iteration.

The block parallel layered decoder architecture is shown in FIG. 15. While the block serial layered architecture is not shown here for brevity, it is based on decoder architecture explained in FIG. 12. We give for both serial and block parallel implementations the ASIC synthesis results hereafter. In the implementation shown in FIG. 15, we have one Check Node Unit 10 of FIG. 14 and a second V-Select Unit 300. The V-select unit 300 computes the extra column values and the extrinsic V messages. This unit 300 is also composed of the blocks of the V-select block 200: Extra-out, dc-out and De-map. In an alternate implementation, the Extra-Out block of the second V-select unit 300 is removed and the extra column values (FS reliabilities) are also stored in FS storage.

The ASIC implementation results of our T-EMS hardware model, for a serial layered and a block-parallel layered architectures. The efficiency in our implementation (for both cases) comes from two key factors: the first one is the low complexity check node decoding algorithm which has reduced logic and memory requirements, and the second one is the low complexity layered decoder implementation. It can be observed that the block parallel layered decoder gives, as expected, a larger throughput for the same silicon area and number of iterations.

Simulation results on several different NB-LDPC codes, and we compare the T-EMS with a BP-FFT (Fourier Fast Transform) representation. All the simulations assume a transmission over a BPSK-AWGN channel. Both the T-EMS and the BP-FFT have been simulated on floating point implementation using the layered scheduling.

Figure 17:
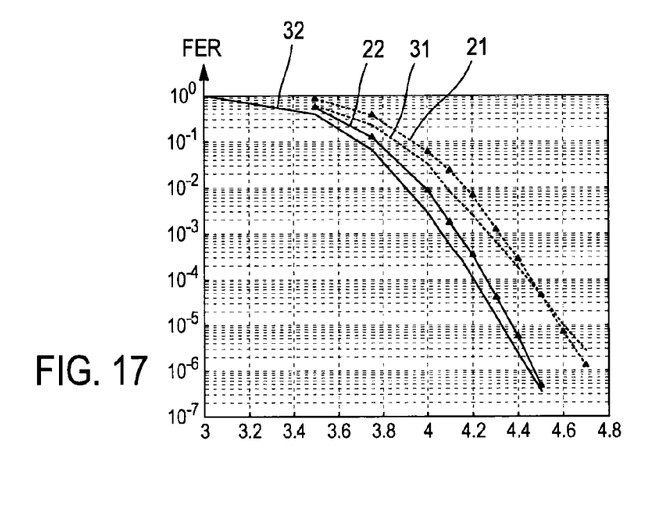
FIGS. 17 and 18, performance results (FER) of a Quasi-Cyclic (QC) NB-LDPC code in GF(4) with different symbols length and degree distributions according to the invention in comparison to BP-FFT conventional code.

FIG. 17 shows the performance comparison of a QC-NB-LDPC code in GF(4) with length $N_s$=1536 symbols and degree distribution $(d_v,d_c)$=(4,32). The parameters of the T-EMS are $n_r$=2 and $n_c$=3. After the offset compensation, the T-EMS 21 and 22 shows similar performance compared to BP-FFT 31 and 32. The good performance of the T-EMS is also shown after only ten decoding iterations, where the T-EMS has better performance than the BP-FFT in the error floor region. Finally, although the value of the offset $\delta$=0.8 given by the threshold analysis has been used in the simulations, an offset value of $\delta$=1.0 gives performance with no measurable degradation in the waterfall region. Using a value of $\delta$=1.0 is an advantage since it limits the number of precision bits to represent the offset value in the hardware implementation of the T-EMS (the figures reported on table I assume a value of $\delta$=1.0)

Figure 18:
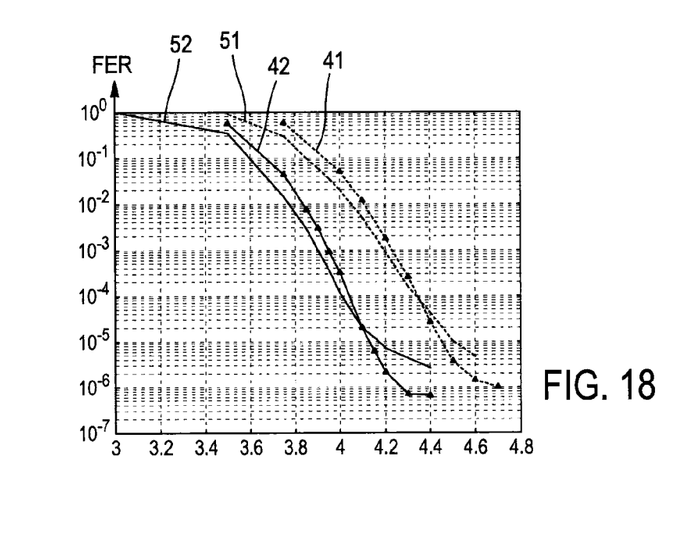

FIG. 18 shows the performance comparison of a GF(4) code with length $N_s$=3888 symbols with $(d_v,d_c)$=(3,27) of T-EMS 41, 42 and BP 51, 52 after respectively 10 and 100 decoding iterations. The parameters of the T-EMS are $n_r$=2 and $n_c$=3. For such code, the column degree $d_v$=3 is too low and shows a pronounced error floor at FER=$10^{-6}$. With the T-EMS, and after both 10 and 100 decoding iterations, we get a performance gain in the error floor (the error floor is at FER=$10^{-7}$ for the T-EMS), with practically no loss in the waterfall region.

Figure 19:
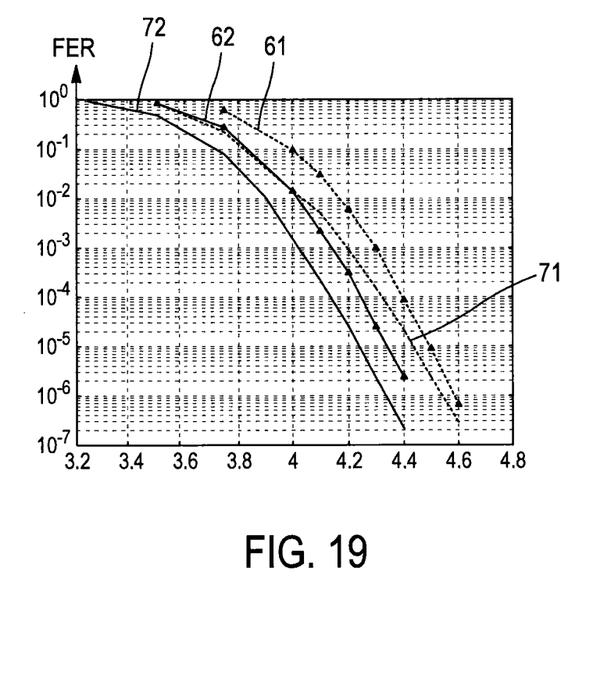
FIGS. 19 and 20, performance results of the T-EMS representation according to the invention for higher Galois field orders, respectively GF(8) and GF(64).
Figure 20:
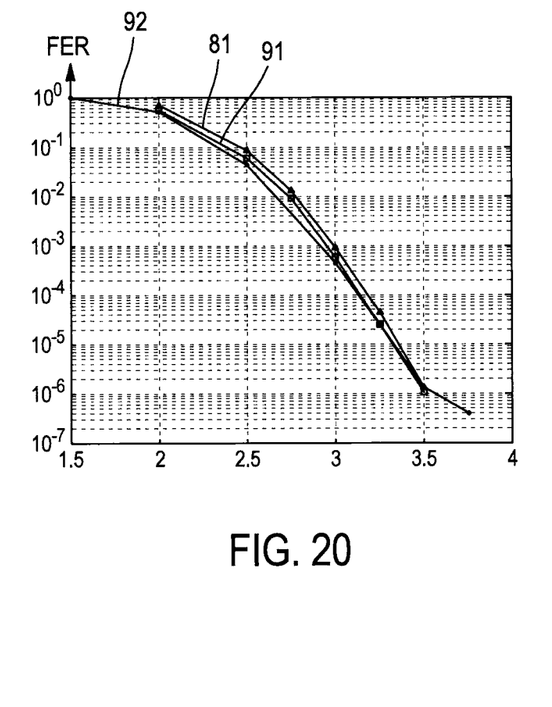

Finally, in order to show that the T-EMS is also an efficient decoding solution for higher Galois field orders, we show in FIG. 19 the performance 61, 62 of a GF(8) code with length $N_s$=1536 symbols and $(d_v,d_c)$=(4,32), and in FIG. 20 the performance 81 of a GF(64) code with length $N_s$=192 symbols and $(d_v, d_c)$=(2, 8).

For the GF(8) code, the parameters of the T-EMS are $(n_r$=2, $n_c$=3). In this case, the loss of T-EMS compared to BP-FFT 71, 72 is more important than in GF(4), but stays reasonable, as the loss in the waterfall region is only between 0.05 dB and 0.10 dB. Note that for the code in FIG. 19, the rate is very high (R=0.875), and the corresponding very large value of $d_c$ prevents the use of the EMS for simulations, due to its extremely poor decoding latency.

As for the GF(64) code with small length and much lower rate, it can be seen that the T-EMS 81 with parameters $(n_r$=2, $n_c$=3) and the EMS 91 with parameters $(n_m$=13,$n_c$=3) have the same decoding performance, and are both very close to the BP results 92 with optimized offset compensation. This last figure shows that although the T-EMS reduces the number of configurations compared to the EMS, it does not lose any performance.

The invention claimed is:

1. A decoding method to compute $d_c$ output vectors of a non-binary parity-check (NBPC) equation decoding unit used for LDPC check codes defined in a NB space, comprising:
   converting reliability vector messages of $d_c$ input vectors of a NBPC equation decoding unit to reliability vector messages of a delta domain, computed in logarithm-form with a value of maximum reliability as a reference for the corresponding conversion of an input vector to the delta domain reliability vector;
   determining one or more minimum values among each and every collection of the delta domain input vector entries corresponding respectively to each and every possible non-zero state of the NB space;
   storing in a final state (FS) storage, for respectively each and every possible non-zero state of the NB space, one or more minimum values and indicia of minimum values locations in an extra compressed state, called FS as above;
   computing a FS reliability, for each and every possible non-zero state of the NB space, as a result of a selection either of the minimum value of the considered non-zero state of the NB space, or of a combination sum of at least two minimum values stored in the FS storage;
   setting the FS reliability for the zero state of the NB space as zero; and
   computing the $d_c$ output vectors of reliabilities in a delta domain representation, based on the minimum values and indicia of minimum values locations stored in the FS storage and the FS reliabilities.

2. The decoding method of claim 1, further comprising storing FS reliabilities in the FS storage and accessing them from FS storage to be used for the computation of the dc output vectors of reliabilities in the delta domain representation.

3. The decoding method of claim 1, wherein the computation of the FS reliabilities for each and every non-zero-state of the NB space uses the selection of one minimum or the combination sum of at least two minimum values, while the $d_c$ output vectors of reliabilities in the delta domain representation are computed using an equal or larger number of minimum values compared to the number of minimum values used for the computation of the FS reliabilities.

4. The decoding method of claim 1, wherein the computation of the final state reliabilities for each and every non-zero-state of the NB space uses only one minimum, while the $d_c$ output vectors of reliabilities in the delta domain representation are computed using two or more minimum values stored in the FS storage.

5. The decoding method of claim 1, further comprising storing the minimum values in the dc output vectors of reliabilities in the delta domain representation, in addition to storing the minimum values in the FS storage.

6. The decoding method of claim 1, further comprising computing the $d_c$ output vectors of reliabilities of a check-node in the delta domain representation can be scheduled any time after the availability of compressed state of that check-node.

7. The decoding method of claim 1, further comprising summing the check-node units output message and check-node units input message to produce a total reliability message.

8. The decoding method of claim 1, further comprising generating and computing the $d_c$ output vectors of reliabilities in the delta domain representation belonging to previous iteration, during current iteration, based on the minimum values and indicia of minimum values locations belonging to previous iteration that are stored in the FS storage.

9. The decoding method of claim 1, further comprising delaying a check-node units input message in a memory until a check-node unit output message is generated.

10. A decoding apparatus comprising NB-LDPC codes with software instructions programmed into a non-transient memory of a computer controller, including an input, output, and microprocessor, operably running a decoding calculation and steps for NB-LDPC codes, the software including an EMS calculation and logic in a particular representation called trellis arrangement or T-EMS, wherein such a decoding apparatus for decoding $d_c$-sized vector messages comprises a check-node unit (CNU) architecture with two units in connection for each CNU, a Min-finder unit which builds the delta domain trellis representation which contains the minimum values and computes the FS and a V-select unit which computes extra compressed values and extrinsic V messages, such units further comprise:

(a) in the Min-finder unit:
   a series of parallel entries for respective incoming vector messages;
   a series of registers to store indicia of each incoming message in connection with the respective entry;
   a series of substrators to transform each message to the delta domain in connection with the respective register;
   a Min-finder tree to select minimum values and indicia from transformed $d_c$-sized vectors; and (b) in the V-select unit:
   an extra-out block to generate FS reliabilities, also called syndrome reliabilities, based on the values stored in the FS registers;
   a $d_c$-out block composed of subtractors to fill all the $d_c$ extrinsic messages with the syndrome values and the stored configurations; and
   a message de-map block composed of substrators to transform the messages back to output messages of the normal domain.

11. The decoding apparatus of claim 10, wherein:
the minimum values are stored in final states registers;
the extra-out block includes adders and multiplexers; and
the configuration associated to each syndrome value and indicia of minimum values are stored in temporary registers of the extra-out block.

12. The decoding apparatus of claim 10, further comprising a block parallel layered decoder architecture comprises one CNU and a second V-select unit to compute the FS reliabilities values and the extrinsic V messages, the V-select unit including an extra-out block, a $d_c$-out block and a de-map block.

13. The decoding apparatus of claim 12, wherein the extra-out block of the second V-select unit is removed and the FS reliabilities values are also stored in final state storage.

* * * * *